(12) United States Patent
Yoon

(10) Patent No.: US 7,708,515 B2
(45) Date of Patent: May 4, 2010

(54) APPARATUS FOR LOADING SUBSTRATE OF LIQUID CRYSTAL DISPLAY

(75) Inventor: Sung-Hwan Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 944 days.

(21) Appl. No.: 11/477,630

(22) Filed: Jun. 30, 2006

(65) Prior Publication Data

US 2007/0154293 A1    Jul. 5, 2007

(30) Foreign Application Priority Data

Dec. 29, 2005    (KR)    ...................... 10-2005-0134598

(51) Int. Cl.
*B65G 1/06* (2006.01)
(52) U.S. Cl. ................................. 414/416.07
(58) Field of Classification Search ............ 414/331.09, 414/279, 411, 937, 416.05, 416.07, 416.08; 198/780
See application file for complete search history.

(56) References Cited

U.S. PATENT DOCUMENTS

| 4,141,458 | A | * | 2/1979 | Brooks et al. | .......... | 414/331.18 |
| 4,697,974 | A | * | 10/1987 | Eltoukhy | ................ | 414/331.09 |
| 5,544,734 | A | * | 8/1996 | Gebhardt | .................... | 198/412 |
| 6,056,828 | A | * | 5/2000 | Tateyama | ....................... | 134/2 |
| 6,230,721 | B1 | * | 5/2001 | Miyasako | ..................... | 134/61 |
| 6,236,021 | B1 | * | 5/2001 | Fair et al. | ..................... | 219/388 |
| 6,681,916 | B2 | * | 1/2004 | Hiroki | ..................... | 198/347.1 |
| 7,311,488 | B2 | * | 12/2007 | Park | ............................ | 414/663 |
| 7,431,551 | B2 | * | 10/2008 | Liu | ........................ | 414/331.09 |
| 2005/0105992 | A1 | * | 5/2005 | An et al. | ..................... | 414/280 |
| 2006/0245860 | A1 | * | 11/2006 | Moriya et al. | ............... | 414/279 |
| 2007/0020067 | A1 | * | 1/2007 | Lin et al. | ............... | 414/331.09 |
| 2007/0114111 | A1 | * | 5/2007 | Liu | ............................. | 198/780 |

FOREIGN PATENT DOCUMENTS

| JP | 2004-172419 | 6/2004 |
| KR | 2004-0025841 | 3/2004 |

* cited by examiner

*Primary Examiner*—Charles A Fox
(74) *Attorney, Agent, or Firm*—Morgan Lewis & Bockius LLP

(57) ABSTRACT

An apparatus for transferring a plurality of substrates in manufacturing a liquid crystal display, includes a storage unit to store the plurality of substrates, an unloading member disposed in the storage unit to unload the substrates from the storage unit, a cassette disposed in the storage unit to lift and lower the plurality of substrates between respective storage substrate positions and the unloading member, a processing equipment to receive the substrates unloaded from the cassette, and a substrate feeder to receive the substrates from the storage unit unloaded by the unloading member and to load the substrates into the processing equipment.

7 Claims, 3 Drawing Sheets

APPARATUS FOR LOADING SUBSTRATE OF LIQUID CRYSTAL DISPLAY

The present invention claims the benefit of Korean Patent Application No. 134598/2005 filed in Korea on Dec. 29, 2005, which is hereby incorporated by reference.

BACKGROUND OF THE INVENTION

1. Field of the Invention

The present invention relates to an apparatus for loading a substrate of a liquid crystal display (LCD) and, more particularly, to an apparatus for loading a substrate of an LCD capable of reducing the cost while enhancing the speed of a loading process of substrates into processing lines.

2. Discussion of the Related Art

Recently, as various mobile electronic devices, such as mobile phones, PDAs, and notebook computers are developed, demands for flat panel display devices, which are light, small, and thin are increasing for mobile electronic devices. Examples of flat panel display devices include liquid crystal displays (LCDs), plasma display panels (PDPs), field emission displays (FEDs), and vacuum fluorescent displays (VFDs) which are being actively studied. Among them, the LCD is receiving much attention because of advantages including easy mass-production, simple driving unit, and high quality pictures. An LCD displays information on a screen using anisotropic properties of liquid crystals.

With reference to FIG. 1, LCD 1 includes a lower substrate 5, an upper substrate 3 and a liquid crystal layer 7 formed between the lower substrate 5 and the upper substrate 3. The lower substrate 5 is a driving element array substrate. Although not shown, a plurality of pixels are formed on the lower substrate 5. Each pixel on the lower substrate 5 includes a driving element such as a thin film transistor (TFT). The upper substrate 3 is a color filter substrate which includes color filter layers for actually implementing colors. Pixel electrodes and common electrodes are formed on the lower and upper substrates 5 and 3 (not shown), and an alignment film for aligning liquid crystal molecules of the liquid crystal layer 7 is coated (not shown). The lower and upper substrates 5 and 3 are attached by a sealant 9 with the liquid crystal layer 7 being formed therebetween. The amount of light transmitted through the liquid crystal layer 7 is controlled by driving the liquid crystal molecules, thereby allowing information to be displayed. The liquid crystal molecules are driven by a driving element formed on the lower substrate 5.

The fabrication process of the LCD includes a plurality of steps which will now be described with reference to FIG. 2. FIG. 2 shows two branches of processes. In FIG. 2, the left branch corresponds to the process for the lower substrate 5, and the right branch corresponds to the process for the upper substrate 3. First, in step S101, a plurality of gate lines and a plurality of data lines are formed to define each pixel region on the lower substrate 5 in the driving element array process. Further, in step S101, TFTs and driving elements are formed in the pixel regions, connected to the gate lines and data lines. In addition, pixel electrodes are formed connected to the TFTs through the TFT array process S101 to drive the liquid crystal layer when a signal is applied through the TFTs. At the same time, in step S104, R, G and B color filters for implementing colors and common electrodes are formed on the upper substrate 3 according to the color filter process S104.

Subsequently, in step S102, an alignment film is coated on the lower substrate 5 and then rubbed to provide an alignment anchoring force or a surface fixing force. At the same time, in step S105, an alignment film is coated on the upper substrate 3 and then rubbed to provide an alignment anchoring force or a surface fixing force. These forces are applied to the liquid crystal molecules of the liquid crystal layer formed between the upper and lower substrates 3 and 5.

Thereafter, in step S103, spacers for uniformly maintaining a cell gap spread on the lower substrate 5 is dispersed. And at the same time, in step S106, the sealant 9 is coated on an outer edge portion of the upper substrate 3. Subsequently, the lower and upper substrates 5 and 3 are attached by applying pressure thereto, in the assembling step S107.

The lower and upper substrates 5 and 3 are formed as large-scale glass substrates. In other words, a plurality of panel regions are formed on a single large-scale glass substrate, where the TFTs, the driving elements, and the color filter layers are formed on each panel region. Therefore, in order to fabricate each liquid crystal panel, the glass substrates should be cut and processed. This is performed in the cutting panel step S108.

Thereafter, in step S109, liquid crystal is injected into each of the processed liquid crystal panels through a liquid crystal injection hole, and the liquid crystal injection hole is sealed to form the liquid crystal layer. Finally, each liquid crystal panel is tested in the testing step S110.

Each process presented above is performed in separate processing equipment. Thus, whenever each process is completed, the substrates 3 and 5 are transferred to the next processing equipment. Here, the substrates 3 and 5 are transferred in the form of cassettes. The substrates 3 and 5 are initially loaded in a cassette, transferred while in the cassette to a different port, unloaded from the cassette, loaded to a corresponding processing equipment, and then subjected to a corresponding process.

FIG. 3 shows a related art substrate loading apparatus 70 for unloading the substrate 1 from the cassette 20 and loading it to the processing equipment 60. As shown in FIG. 3, the cassette 20 that receives a plurality of substrates 1 is positioned at port 30. In this case, the cassette 20 is arranged such that it can be either lifted or lowered in the port 30. As the substrate 1 is unloaded, starting from the lowermost substrate 1, the cassette 20 is lowered accordingly. A robot 50 is installed in front of the cassette 20. The robot 50 includes a base 51, robot arm 52, and a shaft 54. The base 51 is formed on a guide rail 40, which can move along the guide rail 40. The shaft 54, which is able to be rotated simultaneously when lifted, is installed on the base 51. The robot arm 52, which can extend to allow the substrate 1 to be mounted on an end portion thereof, is installed at the shaft 54. A processing equipment 60 is provided at the opposite side of the port 30 along the guide rail 40, and performs a process on the substrate 1 when the substrate 1 is unloaded from the cassette 20.

In the substrate loading apparatus 70 shown in FIG. 3, the arm 52 of the robot 50 is positioned with a pre-set height so as to be able to extend into the cassette 20 to mount the lowermost substrate 1. When the lowermost substrate 1 is unloaded and mounted on the robot arm 52, the robot 50 then moves along the guide rail 40 to load the unloaded substrate 1 into the processing equipment 60. After one substrate 1 is unloaded, the cassette 20 is lowered. Here, the movement distance of the cassette 20 is the same as the receiving interval inside the cassette 20, so that the next lowermost substrate 1 would be positioned at the height of the robot arm 52 (X2). Thereafter, the same process, previously mentioned, is repeatedly performed to load the next substrate 1 into the processing equipment 60. Such operation is repeatedly performed until all the substrates 1 received in the cassette 20 are unloaded. In other words, the operation is repeatedly performed until the uppermost substrate 1 in the cassette 20 is unloaded.

When the uppermost substrate 1 received in the cassette 20 is unloaded, the cassette 20 comes to a completely lowered state, where the cassette 20 contacts the bottom of the port 30. In this state, the uppermost substrate 1 is mounted on the robot arm 52. Thus, if the position (X2) of the robot arm 52 is not as high as distance from the bottom to the uppermost substrate 1 of the cassette 20 (X1), even after the cassette 20 is completely lowered, the uppermost substrate 1 of the cassette 20 cannot be mounted on the robot arm 52, making it impossible to unload the substrate 1. In other words, the height (X2) of the robot arm 52 should be greater than the height (X1) from the bottom to the uppermost substrate 1 of the cassette 20 (namely, $X2 \geq X1$) in order to unload the substrates 1 from the cassette 20. The height (X3) of the entrance 62 of the processing equipment 60 is generally lower than the height (X2) of the robot arm 52 (X2>X3). Thus, in order to load the substrate 1 unloaded from the cassette 20 into the processing equipment 60, the robot arm 52 should be lowered by a distance of X2−X3.

Therefore, in the related art substrate loading apparatus 70, the loading process is delayed since the robot arm 52 is repeatedly lifted up and lowered down to unload the substrates 1 from the cassette 20 and further to reload the substrates 1 into the processing equipment 60. In addition, as the height of the cassette 20 increases, which allows more substrates 1 to be received at the port 30 in a single cassette 20, the resulting distance that the robot arm 52 is to be lifted or lowered is further increased, which cause more delay in the loading process.

SUMMARY OF THE INVENTION

Accordingly, the present invention is directed to an apparatus for loading substrate of liquid crystal display that substantially obviates one or more of the problems due to limitations and disadvantages of the related art.

An object of the present invention is to provide an apparatus for loading a substrate of a liquid crystal display (LCD) that quickly loads a substrate into a processing equipment by making the height of unloading of the substrate from a cassette and the height of loading the substrate into the processing equipment the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an apparatus for transferring a plurality of substrates in manufacturing a liquid crystal display, includes a storage unit to store the plurality of substrates, an unloading member disposed in the storage unit to unload the substrates from the storage unit, a cassette disposed in the storage unit to lift and lower the plurality of substrates between respective storage substrate positions and the unloading member, a processing equipment to receive the substrates unloaded from the cassette, and a substrate feeder to receive the substrates from the storage unit unloaded by the unloading member and to load the substrates into the processing equipment.

In another aspect, an apparatus for loading a substrate of a liquid crystal display includes a storage unit to store the plurality of substrates, a cassette disposed in the storage unit to lift and lower the plurality of substrates between respective storage substrate positions and the unloading member, a processing equipment to receive the substrates unloaded from the cassette, and a substrate feeder positioned at the same height as the storage unit and an entrance of the processing equipment, unloading the substrates from the cassette, and loading them into the processing equipment.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
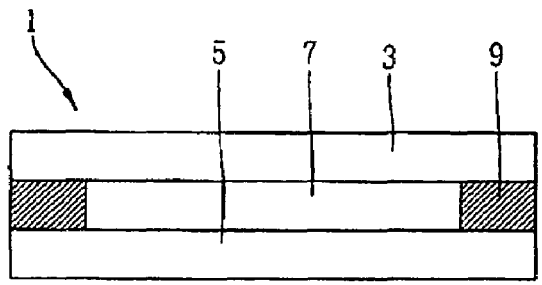
FIG. 1 is a sectional view of a liquid crystal display (LCD) according to the related art.
Figure 2:
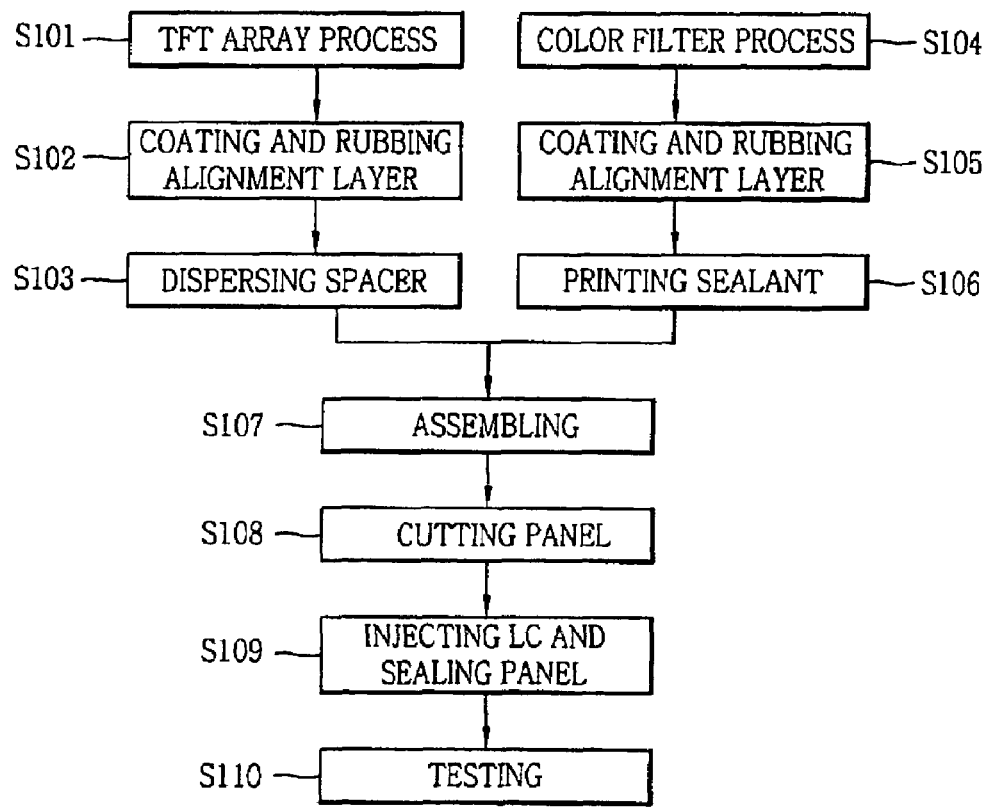
FIG. 2 is a flow chart of a method for fabricating an LCD according to the related art.
Figure 3:
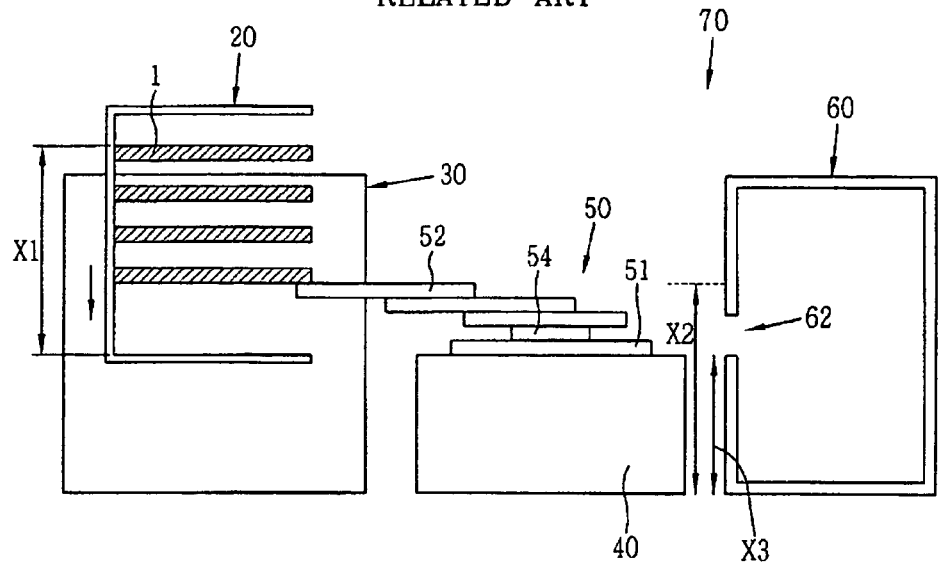
FIG. 3 shows an apparatus for loading a substrate of an LCD according to the related art.
Figure 4:
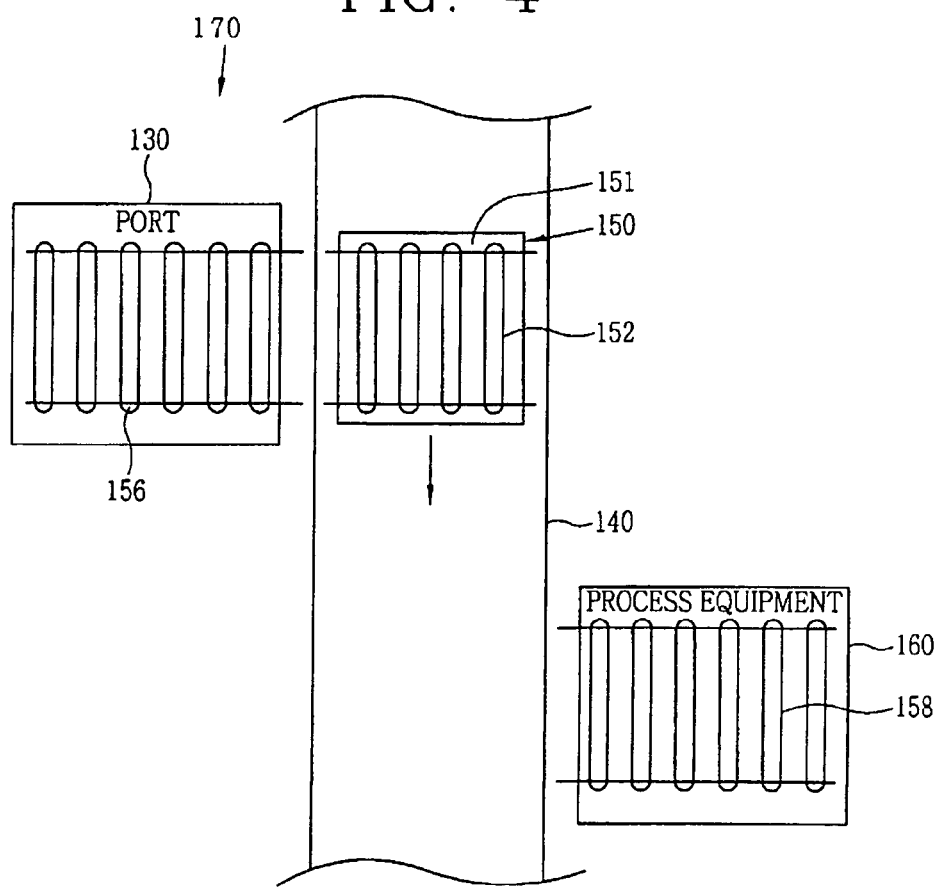
FIG. 4 is a plan view showing the structure of an exemplary apparatus for loading a substrate of an LCD according to the present invention.
Figure 5:
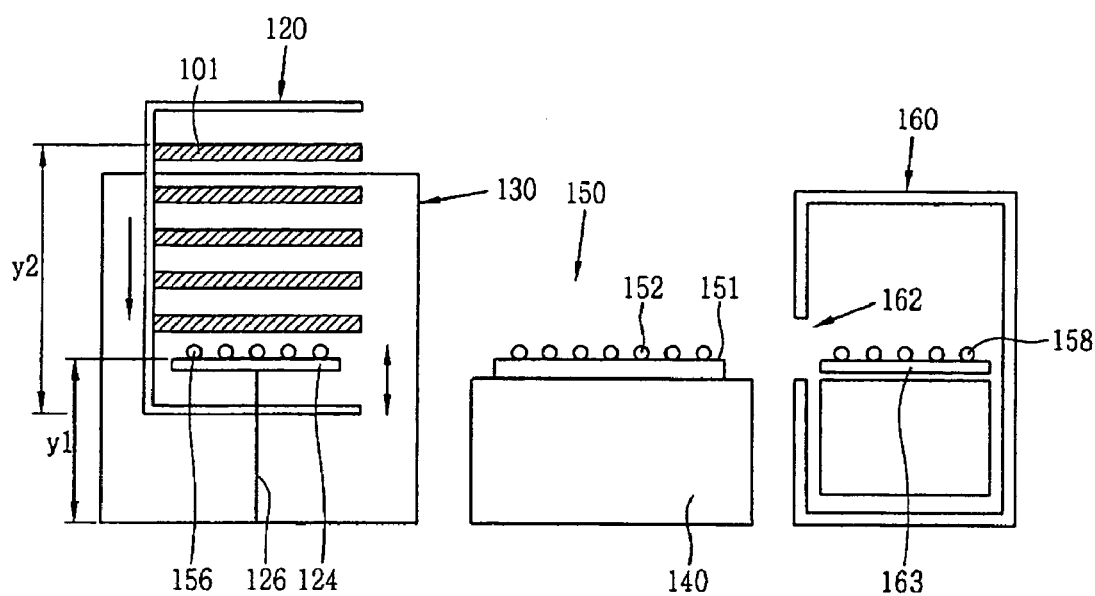
FIG. 5 is a side view showing the structure of the exemplary apparatus for loading a substrate of the LCD according to the present invention.

FIG. 4 is a plan view showing the structure of an exemplary apparatus for loading a substrate 101 of an LCD according to the present invention. FIG. 5 is a side view showing the structure of the exemplary apparatus for loading a substrate of the LCD according to the present invention. As shown in FIGS. 4 and 5, the present invention provides a substrate loading apparatus 170 which does not cause a delay in loading a substrate 101 into a processing equipment 160. A feeder 150 is installed instead of a robot to load a substrate 101 into the processing equipment 160. In particular, by making the height of the feeder 150 to be identical to the height of the entrance 162 of the processing equipment 160, the feeder 150 need not be moved up and down. The feeder 150 is formed as a conveyer which extends from a storage unit such as a port 130, where a cassette 120 is positioned, to the processing equipment 160 so that a substrate 101 of the cassette 120 can be loaded into the processing equipment 160 through the conveyer.

In the exemplary embodiment in FIGS. 4 and 5, rollers are used as a conveyer. Therefore, the terms "rollers" and "conveyer" will be used interchangeably hereinafter for the purposes of this exemplary embodiment. Further, the substrate loading apparatus according to the present invention can be used not only for loading a driving element array substrate or a color filter substrate including color filters but also for loading a liquid crystal panel which include the driving element array substrate and the color filter substrate. Thus, although the loading target is referred to as the substrate in the following description, the substrate can refer to the liquid crystal panel as well as the driving element array substrate and the color filter substrate.

First, the substrate loading apparatus 170 includes a substrate feeder 150, which moves along a guide rail 140. The substrate feeder 150 includes a base 151 moving along the guide rail 140, a plurality of first rollers 152 formed on the base 151, and a second roller 156 formed at the port 130 transferring the substrates 101 of the cassette 120 to the base 151. As the base 151 moves, the first roller 152, and the substrate mounted thereon moves accordingly. Then, the substrate 101 is loaded into the processing equipment 160 through the first roller 152 and the third roller 158, which is formed in the processing equipment 160.

Also, the substrate loading apparatus 170 includes a port 130 in which a cassette 120 where a plurality of substrates 101, received from the previous process after completion, is positioned. The port 130 includes an unloading member 124 for unloading the substrate 101 as the cassette 120 is lowered. Second rollers 156, i.e. second conveyer, are formed on the unloading member 124. The second rollers 156, formed at the same height as the first rollers 152, moves the substrate 101 unloaded from the cassette 120 to the base 151 as the first and second rollers 152 and 156 are driven. A shaft 126 is installed on the unloading member 124 to lift or lower the unloading member 124. Although not shown, a guide bar is installed in the port 130 to lift or lower the cassette 120.

The substrate loading apparatus 170 further includes a processing equipment 160 for receiving the substrates 101 and performing the next process thereon. As previously mentioned, the guide rail 140, which conveys the substrates 101 unloaded from the cassette 120 to the processing equipment 160, is installed between the port 130 and the processing equipment 160. As shown in FIG. 4, the port 130 and the processing equipment 160 are separated with a certain distance therebetween and connected by the guide rail 140. However, they also can be installed to substantially face each other. The third rollers 158 are installed to have the same height as the first rollers 152 on a working table 163 in the processing equipment 160. The third rollers 158 load the substrate 101 transferred along the guide rail 140 into the processing equipment 160. However, the substrate 101 which has been transferred on the base 151 can be loaded into the processing equipment 160 by a different means.

In the substrate loading apparatus 170 constructed as described above, when the cassette 120 with the plurality of substrates 101 is fixed at a certain height in the port 130 and then lowered, the lowermost substrate 101 is mounted on the second rollers 156 formed on the unloading member 124. Generally, in this case, the bottom of the cassette 120 is open and the lower end of the unloading member 124 directly contacts with the substrate 101. The substrate 101 mounted on the second rollers 156 of the unloading member 124 is moved to the base 151 as the second rollers 156 and the first rollers 152 are driven. When the substrate 101 is placed above the base 151 (strictly speaking, on the first rollers 152), the base 151 and the first rollers 152 are moved along the guide rail 140 to reach the entrance 162 of the processing equipment 160. When the substrate 101 reaches the entrance 162 of the processing equipment 160, the first rollers 152 and the third rollers 158 are driven to load the substrate 101 onto the working table 163 of the processing equipment 160.

After the lowermost substrate 110 of the cassette 120 is loaded into the processing equipment 160, the base 151 and the first rollers 152 are moved toward the cassette 120, and at the same time, the cassette 120 lowered by a certain distance, i.e., the interval between the substrates 101 received in the cassette 120, to allow the next substrate 101 to be mounted on the second rollers 156. This process is repeatedly performed to load all the substrates 101 into the processing equipment 160.

In this exemplary embodiment of the present invention, the height of the base 151 moving along the guide roller 140, the height of the second rollers 156 for unloading the substrate 101 from the cassette 120, and the height of the third rollers 158 for loading the substrate 101 into the processing equipment 160 are identical (y1). Therefore, a vertical movement as in the robot in the related art (where the substrate unloading height of the robot and the height for loading the substrate into the processing equipment are different) is unnecessary. Thus, in the present invention, the process can be performed at a higher speed.

Meanwhile, because the height (y2) of the cassette 120 is higher than the substrate unloading height (y1) of the second rollers 156, even when the lower portion of the cassette 120 reaches the bottom after repeatedly loading the substrates 101, the substrate 101 received at a position higher than the height of y1 in the cassette 120 may not be unloaded. This is because the cassette 120 cannot be lowered any more. In this case, the shaft 126 connected with the unloading member 124 is lifted to unload the substrate 101 thereon and then lowered to the height (y1) to load the substrate 101 into the processing equipment 160.

As described above, the feeder 150 unloads the substrate 101 from the cassette 120 at a height identical to the substrate loading height of the processing equipment 160 and further loads the substrate 101 into the processing equipment 160. According to the exemplary embodiments described above, the substrate 101 is unloaded from the cassette 120 and then reloaded into the processing equipment 160 using the conveyers. However, the present invention is not limited thereto. The unloading and reloading of the substrate 101 may be performed at the same height, and any means for unloading and loading the substrate can be used so long as it can satisfies the feature.

It will be apparent to those skilled in the art that various modifications and variations can be made in the apparatus for loading substrate of liquid crystal display of the present invention without departing form the spirit or scope of the invention. Thus, it is intended that the present invention cover the modifications and variations of this invention provided they come within the scope of the appended claims and their equivalents.

What is claimed is:

1. An apparatus for transferring a plurality of substrates in manufacturing a liquid crystal display, comprising:
   a storage unit to store the plurality of substrates;
   a first conveyer to transport the substrate in a first direction;
   an unloading member disposed in the storage unit to transfer the substrates from the storage unit to the first conveyer;
   a cassette disposed in the storage unit to lift and lower the plurality of substrates between respective storage substrate positions and the unloading member;
   a substrate feeder to receive the substrates from the storage unit unloaded by the unloading member;
   a second conveyer formed in the substrate feeder to transport the substrate in a second direction perpendicular to the first direction;
   a third conveyer formed in the substrate feeder to transport the substrate in the first direction a processing equipment to receive the substrates unloaded from the cassette by the substrate feeder;

a fourth conveyer installed in the processing equipment to convey the substrates of the substrate feeder into the processing equipment; and a shaft installed in the unloading member to lift and lower the unloading member, the shaft lifting the unloading member to unload the substrate from the cassette and then lowering the unloading member to loading the substrate to the first conveyer when the lower portion of the cassette reaches the bottom.

2. The apparatus of claim 1, further comprising a base installed at a lower portion of the substrate feeder.

3. The apparatus of claim 1, further comprising a shaft installed in the storage unit to lift and lower the unloading member.

4. The apparatus of claim 1, wherein the substrate feeder and the unloading member are positioned at the same height.

5. The apparatus of claim 1, wherein the substrate feeder and the conveyers are positioned at the same height.

6. The apparatus of claim 1, wherein the substrate feeder and the unloading member are formed of a plurality of rollers.

7. The apparatus of claim 1, wherein the substrate feeder, the unloading member, and the fourth conveyer are formed of a plurality of rollers.

* * * * *